United States Patent [19]
Takami et al.

[11] Patent Number: 4,806,748
[45] Date of Patent: Feb. 21, 1989

[54] PHOTO-ELECTRIC CONVERSION CIRCUIT

[75] Inventors: Satoshi Takami; Yutaka Ohsawa, both of Tokyo, Japan

[73] Assignee: Asahi Kogaku Kogyo Kabushiki Kaisha, Tokyo, Japan

[21] Appl. No.: 65,436

[22] Filed: Jun. 23, 1987

[30] Foreign Application Priority Data

Jun. 23, 1986 [JP] Japan ............... 61-144798

[51] Int. Cl.⁴ .................................. H01V 40/14
[52] U.S. Cl. ..................... 250/214 R; 250/214 C
[58] Field of Search ............... 250/214 R, 214 C, 206, 250/212; 354/464; 307/311, 308; 356/213, 223

[56] References Cited

U.S. PATENT DOCUMENTS

| | | | |
|---|---|---|---|
| 3,688,302 | 8/1972 | Lampkin | 250/214 R |
| 3,734,632 | 5/1973 | Matsuda | 250/214 C |
| 3,911,268 | 9/1975 | Mori et al. | 250/214 R |
| 3,944,370 | 3/1976 | Kawasaki | 250/214 R |
| 4,051,490 | 9/1977 | Kawasaki | 356/223 |
| 4,106,035 | 8/1978 | Kawasaki et al. | 354/464 |
| 4,180,310 | 12/1979 | Kawasaki et al. | 354/464 |

Primary Examiner—David C. Nelms
Attorney, Agent, or Firm—Sughrue, Mion, Zinn, Macpeak & Seas

[57] ABSTRACT

A photoelectric amplifier comprising a photodiode having an anode connected to a gate of a first FET and a cathode connected to a gate of a second FET, with the second FET having a source-gate interconnection so as to be self-biasing. The photodiode cathode is connected to a high impedance feedback loop, including an output transistor, which is connected back to the photodiode anode. In a preferred embodiment, further included is a feedback circuit gain controlling transistor having a base driven by the feedback circuit and a current electrode connected to the source of the first FET.

10 Claims, 3 Drawing Sheets

PHOTO-ELECTRIC CONVERSION CIRCUIT

BACKGROUND OF THE INVENTION

1. Field of the Invention

This invention relates to a photo-electric conversion circuit utilizing a photodiode, which can be effectively incorporated, for instance, in the photometric circuit of a camera.

2. Background of the Invention

A variety of photo-electric conversion circuits, which form a part of the photometric circuit of a camera, have been proposed in the art. One example of the photo-electric conversion circuits is as shown in FIG. 1.

In the conventional circuit of FIG. 1, a photodiode 1 is connected between the gate and the source of FET (field-effect transistor) 3 which forms a source follower circuit with a resistor 2. The gate of the FET 3 is connected to the collector of a compression transistor 4. A high input impedance circuit made up of the FET 3, an output transistor 5 and exposure factor setting variable resistors 6 and 7 is connected between the base and the collector of the gate drive transistor 4 so that the compression transistor 4 performs a compression action on the photo-electric conversion voltage.

The output transistor 5 in the feedback circuit is driven by a constant current on the constant current action of a transistor 10 which is biased by an FET 8 and a diode-connected transistor 9. Therefore the variable resistors 6 and 7 show linear resistance.

In the above-described photo-electric conversion circuit, the photodiode 1 is negative-biased by a reverse voltage at all times. Its photocurrent flows into the compression transistor 4, so that a compression voltage $E_1$ is developed between the base and the emitter of the compression transistor 4. The compression voltage $E_1$ corresponds to the APEX data of an object's luminance.

The compression voltage $E_1$ is added to the terminal voltage $E_2$ and $E_3$ across the variable resistors 6 and 7 which are determined according to exposure factors such as for instance a film sensitivity. This voltage sum $(E_1+E_2+E_3)$ is applied to an output line 11.

The above-described photo-electric conversion circuit has been disclosed in Japanese Patent Application Publication No. 22167/1984, U.S. Pat. Nos. 4,106,035 and 4,180,310 corresponding to the Japanese application.

The above-described conventional photo-electric conversion circuit has problems to be solved with respect to the following two points.

(1) Since the photodiode 1 is negative-biased by the predetermined voltage at all times, it can be estimated that the photodiode has an inherent junction capacitance of the order of 300 pF to 600 pF. Therefore, it takes a relatively long period of time for the photodiode to start its normal operation. That is, the response speed of the photodiode is low.

In general, in the case where a photodiode is used as a photo cell, it is preferable that the anode and the cathode are maintained with equal potentials. That is, the photodiode is used in the short-circuit state.

(2) It is desirable that the feedback circuit is a high input impedance circuit whose gain is about one (1). However, in the above-described photo-electric conversion circuit, the gain is liable to decrease because the variations of the compression voltage $E_1$ and of the terminal voltages $E_2$ and $E_3$ of the variable resistors 6 and 7 are fed back to the drain-source voltage $V_{DS}$ of the FET 3. As a result, the junction capacitance of the photodiode has a stronger effect on the operation.

The above-described gain problem concerns the junction capacitance and the grounding capacitance of the FET. However, in practice, these capacitances are so small that they can be disregarded. Thus, the problem mainly affects the junction capacitance of the photodiode 1. The reduction of the response speed due to the junction capacitance is significant especially when the power switch is turned on.

SUMMARY OF THE INVENTION

In order to solve the above-described problems, the following two photo-electric conversion circuits have been developed for the present invention.

In the photo-electric conversion, which has been developed according to a first aspect of the invention, a photodiode is connected between the gate of a first FET and the gate of a second self-biased FET in such a manner that the anode of the photodiode is on the side of the first FET and the cathode thereof is on the side of the second FET, and the drain current of the second FET is predetermined so that a small reverse voltage is developed across the photodiode.

On the other hand, the photo-electric conversion circuit, which has been developed according to a second aspect of the invention, comprises a first FET and a self-biased second FET. A photodiode is connected between the gates of the first and second FETs in such a manner that the anode of the photodiode is on the side of the first FET and the cathode thereof is on the side of the second FET. The gate of the first FET is connected to the collector of a compression transistor. A high input impedance circuit including the first and second FETs is connected to the base of the compression transistor as a feedback circuit. A feedback circuit gain controlling circuit is connected to the drain current path of the first FET for suppressing variation of the drain-source voltage of the first FET according to the compression voltage of the compression transistor.

DETAILED DESCRIPTION OF THE PREFERRED EMBODIMENTS

Embodiments of the invention will be described with reference to the accompanying drawings.

Figure 1:
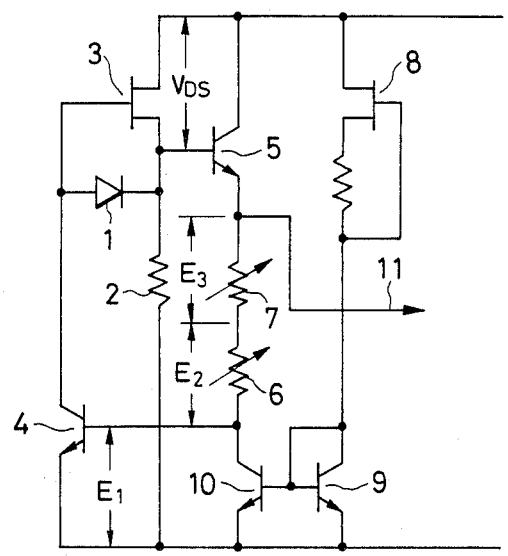
FIG. 1 is a circuit diagram showing one example of a prior art photo-electric conversion circuit.
Figure 2:
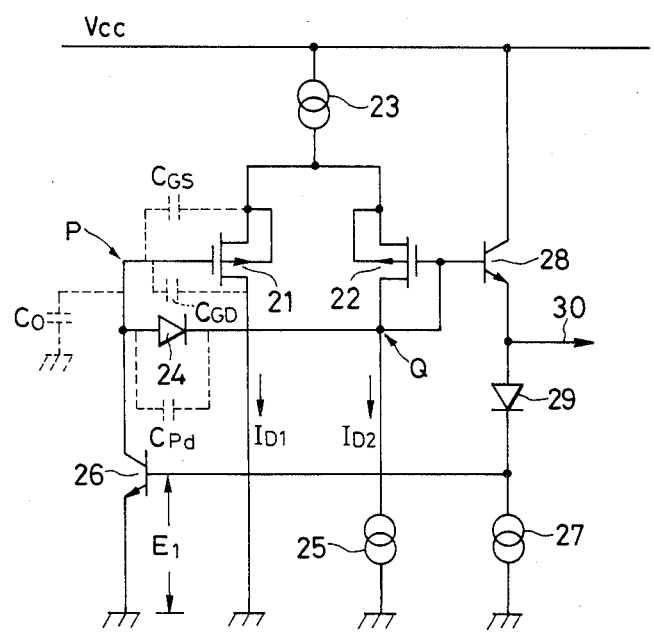
FIG. 2 is a circuit diagram showing a photo-electric conversion circuit according to a first aspect of the invention.

FIG. 2 shows a photo-electric conversion circuit according to a first aspect of the invention. A first FET (field-effect transistor) 21 serving as a buffer transistor and a self-biased second FET 22 serving as a level shifter are driven by a constant current from a first constant current source 23. A photodiode 24 is connected between the gate of the first FET 21 and the second FET 22 in such a manner that the anode is on the side of the first FET 21 and the cathode is on the side of the second FET 22. The same effect is obtained by connecting the cathode of the photodiode 24 to the gate of the second FET 22 because the second FET 22 is self-biased with its gate connected to its drain.

The drain current $I_{D2}$ of the second FET 22 is determined in advance by a second constant current 25 connected to its drain in such a manner that the drain current $I_D$ is smaller than the drain current $I_{D1}$ of the first FET 21.

Figure 3:
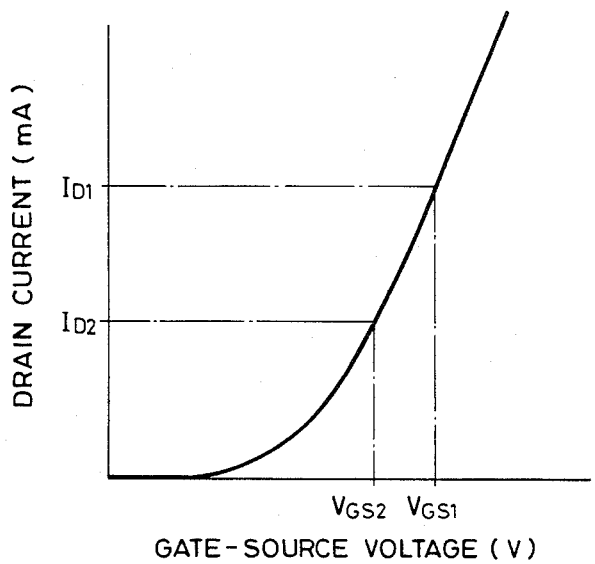
FIG. 3 is a graphical representation showing a $V_{GS}-I_D$ characteristic curve of an FET.

As is apparent form a gate-source voltage vs. drain current ($V_{GS}-I_D$) characteristic curve shown in FIG. 3, because of the difference between the drain currents, the gate-source voltage $V_{GS2}$ of the second FET 22 is lower than the gate-source voltage $V_{GS}$; Of the first FET 21. Because of the difference between the gate-source voltages $V_{GS1}-V_{GS2}'$ the photodiode 24 is negatively biased.

The difference between the gate-source voltages $V_{GS1}$ and $V_{GS2}$ is determined by means of the second constant current source 25 in advance so that the photodiode 24 is operated substantially in the short-circuit state or is biased by a small reverse voltage.

In the circuit thus designed, the effect by the junction capacitance of the photodiode 24 is lessened, and the photodiode 24 can be correctly operated even when a voltage attributed to some sort of trouble is applied thereto.

However, a difficulty is encountered in the case where the above-described photo-electric conversion circuit is incorporated in the photometric circuit of an electronic shutter camera, and a compression transistor 26 is used to obtain a compression voltage from the photocurrent of the photodiode 24. This will be described in more detail.

In the compression transistor 26, feedback is made from the collector to the base by a high input impedance circuit which is made up of the first and second FETs 21 and 22, a buffer transistor 28 driven by a constant current from a third constant current source 27 and a diode 29 provided for level shifting. Therefore, when the photo current flows in the compression transistor 26, a compression voltage $E_1$ is developed between the base and the emitter of the compression transistor 26. The compression voltage $E_1$ thus developed is applied, as a voltage corresponding to the APEX data of an object's luminance, to an output line 30.

In the first photo-electric conversion circuit, the photodiode is negative-biased by a small reverse voltage. As was described above, it is desirable that the photodiode is operated in the short-circuit state. However, sometimes the photodiode is biased by a forward voltage because of troublesome factors such as the characteristic differences of the circuit elements, the stray capacitances of the circuit elements, and electrical noise. This difficulty can be overcome by increasing the negative bias. However, in this case, the adverse effect of the junction capacitance is increased as was described above.

This trouble has been solved by the first photo-electric conversion circuit. That is, in the circuit, the small reverse voltage is applied to the photodiode and it is canceled out by the forward voltage which is induced by the aforementioned troublesome factors so that the photodiode is operated substantially in the short-circuit state.

The voltage provided by the troublesome factors is not so high but affects the operation of the photodiode. In this case, the voltage is applied as a reverse voltage to the photodiode, or it is applied as a forward voltage thereto. In the former case where the voltage is applied as a reverse voltage to the photodiode, sometimes it is added to the negative bias voltage predetermined for the photodiode, and therefore the effect of the junction capacitance is somewhat increased. However, the delay in response by the junction capacitance is substantially small because the voltage thus added is low. In the latter case where the voltage is applied as a forward voltage to the photodiode, as a result of the voltage cancellation, the photodiode is biased slightly in the reverse direction, or is held in the short-circuit state, or is biased slightly in the forward direction. However, the forward bias voltage thus applied is extremely low and, therefore, the photodiode can operate correctly.

Figure 4:
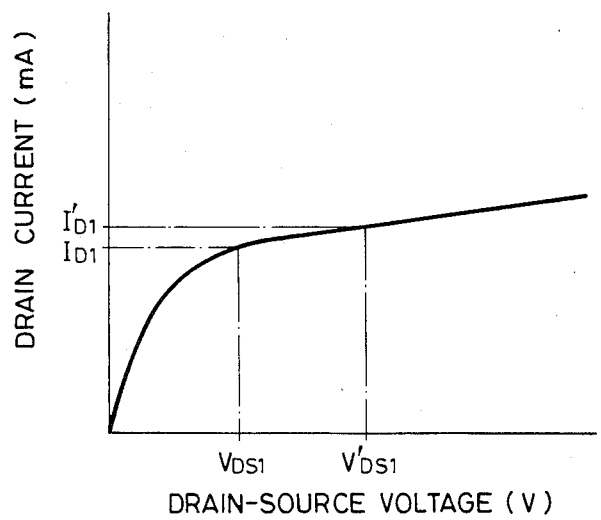
FIG. 4 is also a graphical representation showing a drain characteristic curve of an FET.

However, in the above-described feedback circuit of FIG. 2, the variation of the compression voltage $E_1$ is transmitted through the base-emitter of the transistor 28 and the gate-source path of the second FET 22 to the source of the first FET 21, thus varying the drain-source voltage $V_{DS1}$ of the first FET 21. FIG. 4 shows a drain characteristic (drain-source voltage vs. drain current) of the first FET 21. As is apparent from the drain characteristic curve shown in FIG. 4, when the drain-source voltage changes for instance from $V_{DS1}$ to $V'_{DS1}$, the drain current is changed from $I_{D1}$ to $I'_{D1}$. This variation of the drain current $I_{D1}$ affects the gate-source voltage $V_{GS1}$ that the bias voltage of the photodiode 24 is affected. This effect is based on the negative feedback action of the feedback circuit, thus decreasing the gain. The negative feedback action lowers the response characteristic of the photodiode 24 even when the photodiode is held in the short-circuit state. This will be described in more detail.

It is assumed that, because of the above-described negative feedback, the bias voltage $V_{pd}$ of the photodiode 24 is 300 mV ($V_{pd}=300$ mV), the junction capacitance $C_{pd}$ is 300 pF ($C_{pd}=300$ pF), and a photocurrent $i_{pc}$ ($i_{pc}=30$ pA) flows in the photodiode. The composite capacitance C between the circuit points P and Q in FIG. 2 is given as follows when a mirror integration effect is taken into consideration.

$$C=(1-A)\,C_{pd}+C_{GS}+C_{GD}+C_O$$

where A is the gain of the negative feedback loop.

The capacitances $C_{GS}$, $C_{GD}$ and $C_O$ can be disregarded because they are, in general, less than several tens of picofarads (pF). Therefore, the above equation can be rewritten as follows:

$$C=(1-A)\,C_{pd}$$

Under the aforementioned conditions, according to the capacitive charging equation $CV_{pd}=i_{pc}t$, $$t=300\text{ mV}\times(300\text{ pF}/30\text{ pA})=3\text{ sec}$$

where the worst case of the gain $A=0$ has been assumed.

As is apparent from the above description, it requires significant time for the operating condition of the photodiode 24 to become normal. This phenomenon is significant when the power switch is turned on.

As is apparent from the above description, as the gain A increases to one (1), the capacitance C is decreased, so that the response speed of the photodiode 24 is desirably increased.

The above-described difficulty has been eliminated by a photo-electric conversion circuit according to a second aspect of the invention. One example, of the photo-electric conversion circuit is as shown in FIG. 5.

Figure 5:
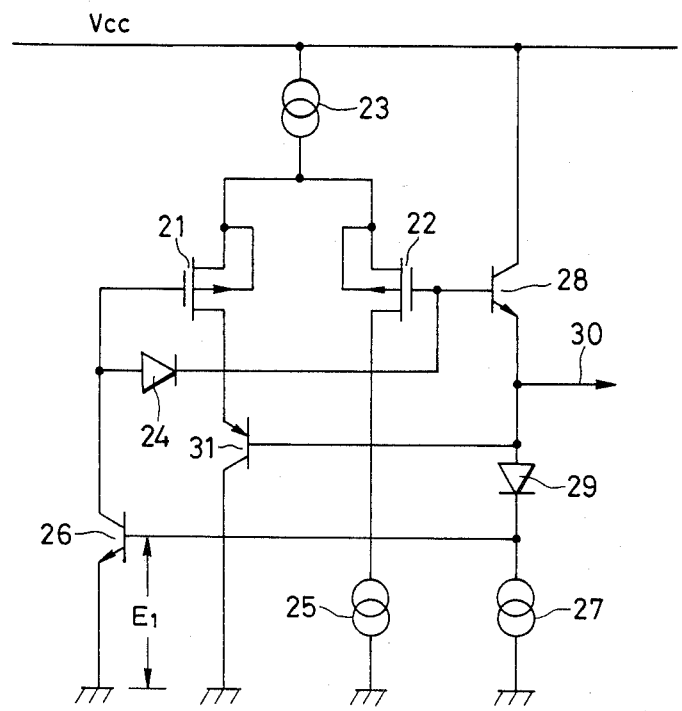
FIG. 5 is a circuit diagram showing a photo-electric conversion circuit according to a second aspect of the invention.

The photo-electric conversion circuit of FIG. 5 is different from that of FIG. 2 only in that a gain controlling PNP transistor 31 is connected to the drain of the first FET 21. The compression voltage $E_1$ is applied to the base of the gain controlling transistor 31. The gain controlling transistor 31 operates in such a manner that the drain potential increases or decreases with the compression voltage $E_1$. That is, the drain potential is increased as the compression voltage $E_1$ increases and the drain potential is decreased as the compression voltage $E_1$ decreases. Therefore, the drain-source voltage $V_{DS1}$ is maintained at a predetermined value irrespective of the variation of the compression voltage $E_1$ and the gain of the feedback circuit is substantially one (1).

The second photo-electric conversion circuit is formed by adding the compression transistor to the first photo-electric conversion circuit, so that the compression voltage is outputted according to the luminance of an object. The specific feature of the second photo-electric conversion circuit resides in the provision of the gain controlling transistor for maintaining the gain of the feedback circuit at one (1).

That is, in the second photo-electric conversion circuit, the gain controlling transistor operates to suppress the variation of the drain-source voltage of the first FET according to the variation of the compression voltage. Therefore, the drain current of the first FET is independent of the variation of the compression voltage, and the gate-source voltage of the first EFT is maintained at a predetermined value. As a result, the negative feedback of the compression voltage variation to the negative bias of the photodiode is prevented.

In the above-described embodiments, the MOS type P-channel field-effect transistors (FETs) are used. However, N-channel FETs can be used in the same manner with the circuit elements inverted in polarity. In addition, the MOS type FETs may be replaced by semiconductor elements which are similar in function to them.

As was described above, in the photo-electric conversion circuit according to the first aspect of the invention, the photodiode is operated in the short-circuit state or is biased slightly in the reverse direction. Therefore it shows no delay in response and it is free from the difficulty that the photovoltaic effect is lowered by the voltage which arises from troublesome factors such as, for instance, the difference in characteristics of circuit elements.

In the photo-electric conversion circuit according to the second aspect of the invention in which the compression voltage is obtained from the photocurrent of the photodiode, the gain of the feedback circuit can be maintained substantially at 1 (one), which has effectively eliminated the difficulty that the response of the photodiode is delayed by the feedback circuit.

What is claimed is:

1. A photoelectric conversion circuit, comprising:
   first transistor means;
   self-biased second transistor means;
   photodiode means connected between gates of said first and second transistor means by having an anode connected to a gate electrode of said first transistor means and a cathode connected to a gate electrode of said second transistor means; and
   means for controlling a drain current of said second transistor means to a predetermined value, whereby said predetermined value of drain current causes said photodiode mans to be biased in one of a first and second state, wherein in a first state said photodiode means is based slightly in a reverse direction, and in a second state said photodiode means is biased in a short-circuit state.

2. A photoelectric conversion circuit as recited in claim 1, further comprising second means for controlling a sum of drain currents of said first and second transistors.

3. A photoelectric conversion circuit as recited in claim 2, comprising:
   third transistor means connected to said gate of said first transistor means;
   a feedback circuit for providing a feedback path between a collector and base of said third transistor means, wherein said feedback circuit comprises said first and second transistor means, and a fourth transistor means driven by a constant current.

4. A photoelectric conversion circuit as recited in claim 3, wherein fifth means is connected to a drain of said first transistor means, for maintaining a drain-to-source voltage of said first transistor means at substantially a predetermined value.

5. A photoelectric conversion circuit as recited in claim 1, wherein a drain of said second transistor means controls an output of said photoelectric conversion circuit, and wherein fifth transistor means is connected to a drain of said first transistor means, for maintaining a drain-to-source voltage of said first transistor means at substantially a predetermined value.

6. A photoelectric conversion circuit, comprising:
   first transistor means;
   self-biased second transistor means;
   photodiode means connected between gates of said first and second transistor means by having an anode connected to a gate electrode of said first transistor means and a cathode connected to a gate electrode of said second transistor means;
   means for controlling a drain current of said second transistor means to a predetermined value, whereby said predetermined value of drain current causes said photodiode means to biased in one of a first and second state, wherein in a first state said photodiode means is biased slightly in a reverse direction, and in a second state said photodiode means is biased in a short-circuit state; and
   gain controlling means connected between the drain of said first and second transistors, for suppressing a variation of a drain-source voltage of said first transistor.

7. A photoelectric conversion circuit as recited in claim 6, further comprising second means for controlling a sum of drain currents of said first and second transistors.

8. A photoelectric conversion circuit as recited in claim 7, comprising:
   third transistor means connected to said gate of said first transistor means: and
   a feedback circuit for providing a feedback path between a collector and base of said third transistor means, wherein said feedback circuit comprises said first and second transistor means, and a fourth transistor means driven by a constant current.

9. A photoelectric conversion circuit as recited in claim 6, wherein a drain of said second transistor means controls an output of said photoelectric conversion circuit, and wherein compression transistor means is connected to a drain of said first transistor means, for maintaining a drain-to-source voltage of said first transistor means at substantially a predetermined value.

10. A photoelectric conversion circuit as recited in claim 9, wherein said gain controlling means suppresses a variation of a drain-source voltage of said first transistor according to a compression voltage of said compression transistor means.

* * * * *